(12) United States Patent
Yon-Hin et al.

(10) Patent No.: US 6,440,645 B1
(45) Date of Patent: Aug. 27, 2002

(54) PRODUCTION OF MICROSTRUCTURES FOR USE IN ASSAYS

(75) Inventors: Bernadette Yon-Hin; James McCann; Saji Eapen; Christopher Robin Lowe, all of Cambridge (GB)

(73) Assignee: Cambridge Sensors Limited (GB)

( * ) Notice: Subject to any disclaimer, the term of this patent is extended or adjusted under 35 U.S.C. 154(b) by 0 days.

(21) Appl. No.: 09/445,650

(22) PCT Filed: Jul. 20, 1998

(86) PCT No.: PCT/GB98/02161

§ 371 (c)(1),
(2), (4) Date: Dec. 9, 1999

(87) PCT Pub. No.: WO99/03684

PCT Pub. Date: Jan. 28, 1999

(30) Foreign Application Priority Data

Jul. 18, 1997 (GB) .............................. 9715101

(51) Int. Cl.[7] .............................. G03F 7/00; B81C 1/00
(52) U.S. Cl. ..................... 430/322; 430/323; 430/324; 430/320; 435/288.4; 435/288.5
(58) Field of Search ................ 430/320, 322, 430/323, 324; 435/288.4, 288.5

(56) References Cited

U.S. PATENT DOCUMENTS

| | | | |
|---|---|---|---|
| 4,306,013 A | * | 12/1981 | Roach et al. ............... 369/288 |
| 4,666,823 A | * | 5/1987 | Yokota et al. ............... 430/320 |
| 5,035,939 A | | 7/1991 | Conlon et al. ............... 428/137 |
| 5,585,069 A | * | 12/1996 | Zanzucchi .................... 422/100 |
| 5,755,942 A | | 5/1998 | Zanzucchi et al. ............ 204/454 |
| 5,885,470 A | * | 3/1999 | Parce et al. ..................... 216/33 |
| 5,922,591 A | * | 7/1999 | Anderson et al. ......... 435/287.2 |
| 6,364,465 B1 | * | 4/2002 | Chandrasekaran ............ 347/65 |

FOREIGN PATENT DOCUMENTS

| | | | |
|---|---|---|---|
| DE | 19545130 A1 | 6/1997 | .......... G01N/31/20 |
| EP | 0471628 A1 | 2/1992 | .......... H01L/21/033 |
| WO | WO 91/03375 | 3/1991 | ............. B32B/9/00 |
| WO | WO 96/15450 | 5/1996 | .......... G01N/33/50 |
| WO | WO 97/28490 | 8/1997 | ............. G03F/7/00 |
| WO | WO 97/38300 | 10/1997 | .......... G01N/27/26 |

OTHER PUBLICATIONS

Derwent Abstract 90–151393120 of JP2095258 Apr. 1990.

* cited by examiner

Primary Examiner—Mark F. Huff
Assistant Examiner—Nicole Barreca
(74) Attorney, Agent, or Firm—Ohlandt, Greeley, Ruggiero & Perle, LLP; George W. Rauchfuss, Jr.

(57) ABSTRACT

A process for the production of a device having a surface microstructure of wells or channels. In the process one or more steps of screen-printing the microstructure as a curable material onto a plastic substrate, and curing the material. Such a device is also obtained by applying onto a substrate a material that is polymerizable or depolymerizable by irradiation, applying a negative or positive resist photoresist respectively, irradiating the structure and removing the unpolymerized or depolymerized material.

9 Claims, 5 Drawing Sheets

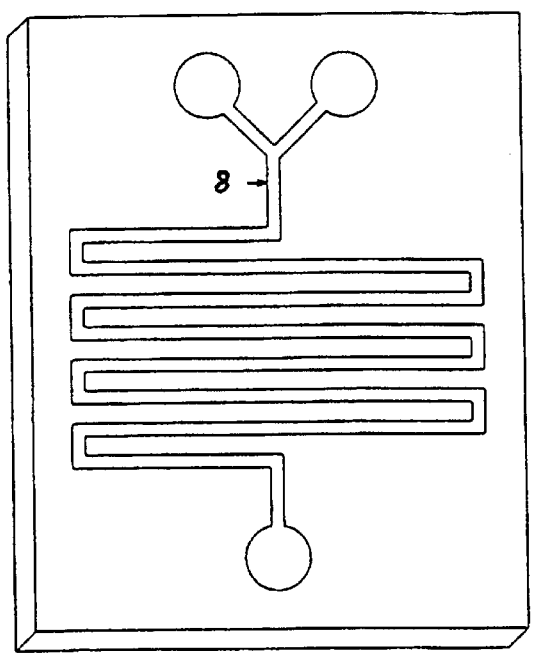
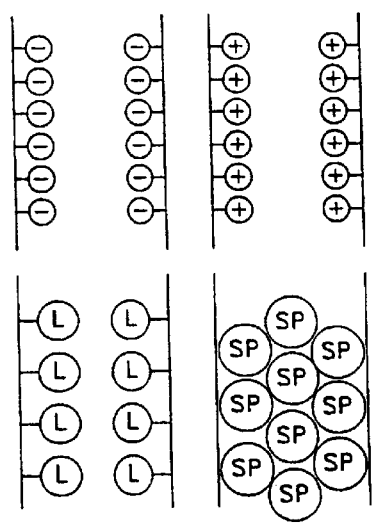
FIG. 4  FIG. 5  FIG. 6

PRODUCTION OF MICROSTRUCTURES FOR USE IN ASSAYS

FIELD OF THE INVENTION

This invention relates to the fabrication of microstructures for use in assays.

BACKGROUND OF THE INVENTION

There is considerable interest in the production of microstructures for the testing and quantitation of species, for the monitoring of binding reactions between molecules, for the manufacture of micro-fluidic systems for drug discovery, for genetic analysis and for clinical diagnostic assays. In particular, there is increasing interest in the development of smaller micro-plates for chemical synthesis, for combinatorial chemistry, for high throughput screening assays, and for binding reactions. The traditional 96-well microtitre plate is being superseded by systems in which there are a greater number, e.g. up to 2304, wells on a plate; see Lemmo et al, Anal. Chem. (1997) 69:543–551.

Plates with greater numbers of small wells have considerable advantages, including the use of lower amounts of expensive reagents and the greater number of reactions that can be screened on one plate, thus reducing costs and maximising throughput. It is also desirable to produce microstructures for valving and pumping liquids on the same device.

SUMMARY OF THE INVENTION

According to one aspect of the present invention, a method for the manufacture of a microstructure comprises the use of screen-printed layers over a sheet material. According to a second aspect of the invention, a microstructure is obtained by photoresist technology.

The methods of the invention allow the production of microstructures, on a plastics substrate, in large volume at low cost. Depending on the technique that is used, they allow the construction of microstructures having resolution down to 3–5 $\mu$m. In one particular embodiment, the microstructure is in the form of a microtitre plate array, into which chemicals, reagents or other materials are dispensed for the carrying out of reactions of interest to the pharmaceutical and diagnostic industry. A device made by this method may be used for analysis of liquid samples, for the detection of binding events between binding partners, for drug discovery applications and for combinatorial chemistry and other reactions.

DESCRIPTION OF THE DRAWINGS

In the accompanying drawings:

FIGS. 2, 3 and 4 are each schematic plan views of further devices that may be produced by the invention; and FIGS. 5, 6, 7 and 8 are schematic sectional views of channels within such devices.

DESCRIPTION OF THE INVENTION

Figure 1:
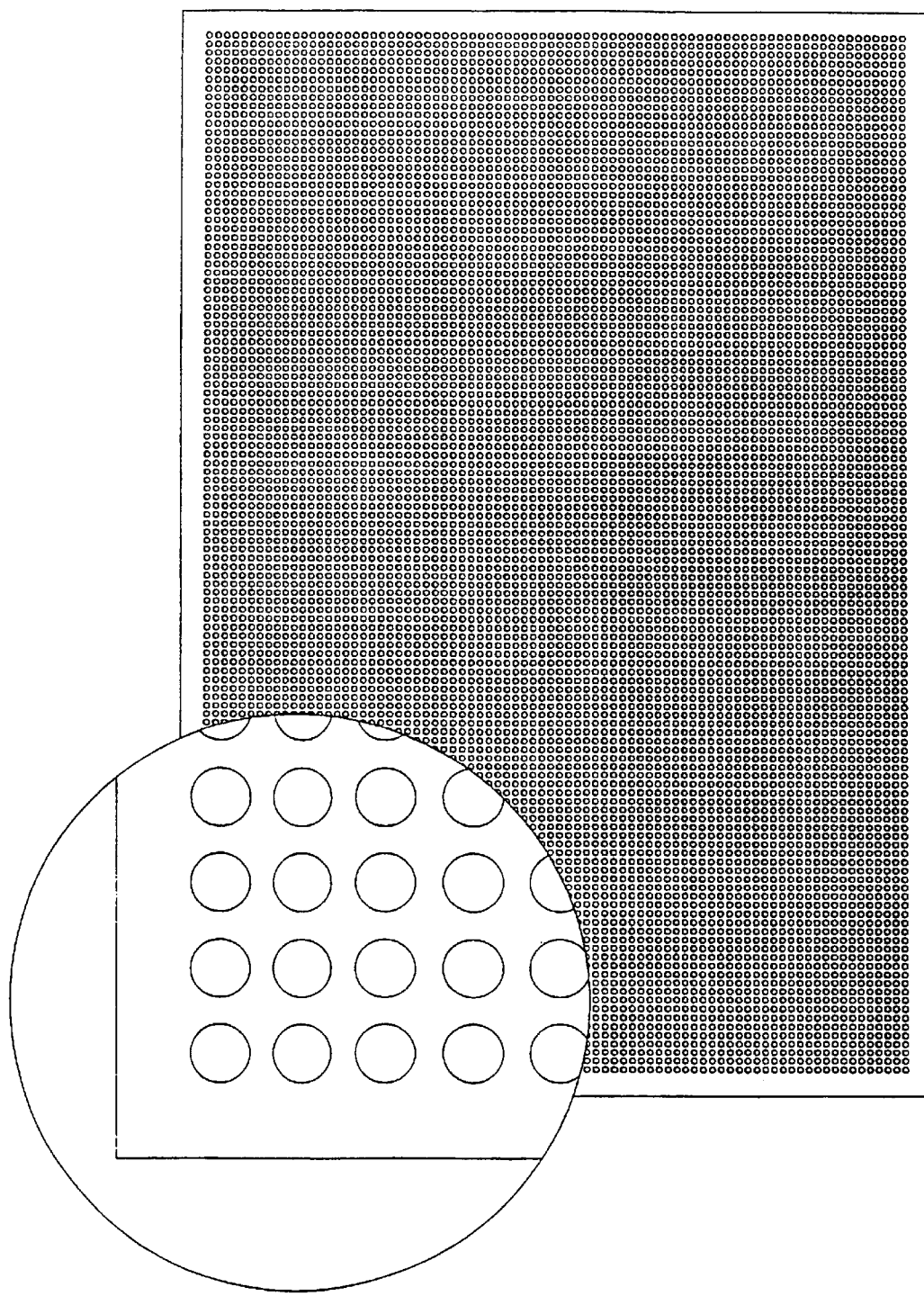
FIG. 1 is a schematic plan view, partially enlarged, of a multi-well device that may be produced by the invention.

Typically, a device of the invention comprises a pattern, e.g. of wells or channels, laid on a non-conducting substrate such as polyester, polypropylene, polycarbonate or polyvinyl chloride or a glass or ceramic. This layer may be treated to make it suitably hydrophobic, if required.

If screen-printing is used, successive layers of screen-printable layers are built up on the sheet material, to give the required pattern(s). The materials are selected to give the appropriate resistance, surface energy or surface tension characteristics needed for the reaction being carried out in the wells formed by the patterns. For example, for combinatorial chemistry reactions in which reactions are to be carried out in highly aggressive solvents (e.g. THF, DMF, NMP, DMSO, xylene or dioxane), the printable layers may partly comprise gel-sol systems, cross-linked epoxy resins or other chemically or UV cross-linked polymers that are known to be resistive to solvent. For applications in the high throughput screening area, or for screening receptor binding reactions, the systems in use are aqueous; in this case, the inks are advantageously selected to give the correct surface tension and wettability factors; resistance to solvents is less important. The substrate may also be selected to give the required resistance characteristics or ability to attach proteins or other binding factors.

By using screen-printing, the resolution of the pattern may be down to 50–70 $\mu$m. Thus, the diameter of each well can be down to 50–70 $\mu$m. For example, wells are 50–500 $\mu$m in diameter; they may be 5–100 $\mu$m deep.

In an alternative embodiment, microstructures having a resolution of as low as 3–5 $\mu$m can be formed in a screen-printed insulation layer by a photoimaging process. In this process, the structure is made by photoimaging, including the use of substances that can be polymerised by the application of light or those that can have their bonds broken by the application of light. These light-sensitive materials are also known as photoimageable resists. Their use provides a low cost, convenient process for the fabrication of microstructures, in a plastics substrate, having properties for these applications comparable to those made by processing on glass.

In a typical application of the process, the device comprises a pattern laid on a non-conducting substrate which may be treated to make it hydrophilic, if desired. A photoimageable hydrophobic layer, such as a photoimageable negative resist, is deposited over the substrate material by a process such as vapour deposition, silk screen printing, spin coating or lithographic printing.

An image of the required pattern is held at the surface of the device, and the system is then exposed to a suitable light source for an appropriate period. The photoimageable layer is then photopolymerised by the light source in those areas that are exposed. In areas that are covered by the mask, the photoimageable layer remains unpolymerised. The mask is therefore designed to cover those areas of the resist that are to be dissolved away by the developer in the next step.

The device is then exposed for an appropriate period to developing solution which dissolves away those areas where the photoimageable layer has not polymerised, to reveal the layer below. In this manner, a regular pattern can be constructed.

In another embodiment of the invention, the same substrate. is used but with a positive photoimageable resist (in this case, the bonds between molecules in the resist are broken when the light is applied). In this case, the positive resist is applied to the previous layer by the chosen process and a mask is placed over the coated device. The mask is designed to expose those areas of the resist that are to be dissolved away by the developer in the next stage. The assembly is exposed to the light source and those areas of the resist exposed to the light have inter-molecular bonds broken by the light, thereby rendering them soluble in the developing solution used in the next stage. Unexposed areas of resist remain unaffected and resistant to the developer.

Thus, when the device is then exposed to the developing solution, the resist is dissolved away by the developer in the exposed areas, to reveal the pattern.

An alternative method of fabricating the device involves the use of dry freestanding photoimageable film resists, e.g. 5–50 μm. A pattern of these film resists, as described by the above procedures, may be formed on the substrate.

In all these processes, resists are chosen that are capable of being developed in mild solutions (aqueous or non-aqueous) that will not damage other exposed areas of the device. Alternatively, masks can be applied to the devices to protect very sensitive parts of the devices from the developing solutions.

Several thousand devices can be fabricated at once. Thus, the process is suitable for high volume-low cost production which is required for many industrial and healthcare applications. The devices can be sufficiently cheap to produce that they can be used once and discarded, thereby preventing carry-over or memory problems associated with reuse.

Devices fabricated according to the invention have several characteristics that are desirable for their use in the analysis of species. For example, a regular pattern can be produced of uniform size and shape. The pattern can be of any shape, including circles, squares, rectangles or bands. Further, various materials can be used for the substrate underneath the screen-printed layers, including treated plastics and plastic/metal laminates. These layers may be modified to enhance the attachment of additional molecules, as described below.

Once the pattern has been formed, further processing may be used to further modify the pattern for analysis, including deposition or bonding or absorption of metals, proteins, enzymes, catalysts and specific binding partners such as antibodies, antigens, DNA or RNA, avidin, biotin or gene probes. These may be deposited by a number of processes, including ink-jet printing, electroplating, electro-deposition and microdispensing.

Analysis of the binding events in the pattern may be carried but by, for example, fluorescence, light scattering or absorption analysis. The light output may be read either from above or, if a transparent substrate is used, from below.

A coverslip may be placed over the device. This may assist flow through the device, e.g. by capillary action or diffusion.

The method of the invention may be used for the manufacture of micro-electrophoresis analysis structures. These structures may be used for the manipulation of biological cells, to promote fusion of cell lines, to promote lysis of cells to extract cell components such as proteins, DNA plasmids or genomic DNA, or to separate cell components. Potential gradients may be set up between electrodes on the device to effect separation of cell components.

Any of a variety of microstructures may be obtained. For example, the pattern may be configured to achieve the separation of DNA for analysis by, for example, the rupturing of the cells, the precipitation of lipid and protein components, and the analysis of the DNA at another site on the pattern.

In another embodiment, chambers and structures can be made of the same order as the size of a cell, to achieve filtration, cell lysis and cell sorting. This is of importance in cell cytometry and haematology. Electrophoresis between electrodes fabricated in the structure may be used to achieve fusion of cell lines, separation of cell contents, DNA/RNA separation and protein separation.

The patterns may also be used in conjunction with techniques for the movement of fluids in micro-patterns such as ultrasonic waves propagating on thin membranes via acoustic streaming or electro-osmotic pumping of cells within a micro-fluidic system.

The patterns may also be configured for the formation of small reaction chambers or reaction sites/wells in which binding reactions occur, between ligands and their binding partners, which can be monitored. Examples are combinatorial chemistry, binding between proteins and receptors, and binding reactions between RNA/DNA in the sites and complementary gene sequences in solutions. The latter will be applicable to gene mapping and diagnostics.

In another embodiment, the microstructure is a micro-array in which DNA/RNA is attached to the array to analyse or sequence the DNA/RNA in a sample. Binding between sample DNA/RNA may be monitored by fluorescence, luminescence or another analysis technique.

In another embodiment, the structures contain whole cell monolayers which are used for assays. The cells are attached by absorption, adsorption, covalently or by another method to surfaces within the device.

By way of general example, a microtitre plate is constructed of an array of micro-wells formed by screen-printable layers placed on a polypropylene or other plastics sheet. The wells are down to 50 μm in diameter, but preferably are of the order of 1–0.5 mm in diameter. Several thousand wells are arranged on each micro-plate. The depth of each well formed by the layers is in the range 5–100 μm. Several layers of screen-printable reagents may be added to increase the depth of the -wells to several hundred μm. The wells are used for reactions suitable for use in the pharmaceutical or diagnostics industry with reagents dispensed into the wells. The wells are read by any of the methods currently used for the monitoring of reactions in the industry, including ELISA, fluorescence binding, luminescence and light scattering.

Chemical amplification reactions such as the Polymerase Chain Reaction (PCR) and the Ligase Chain Reaction (LCR) may be performed on microchannel structures printed on polymeric substrates including polypropylene, polystyrene, polyester, polycarbonate and polytetrafluoroethylene using a UV crosslinkable ink.

Figure 2:
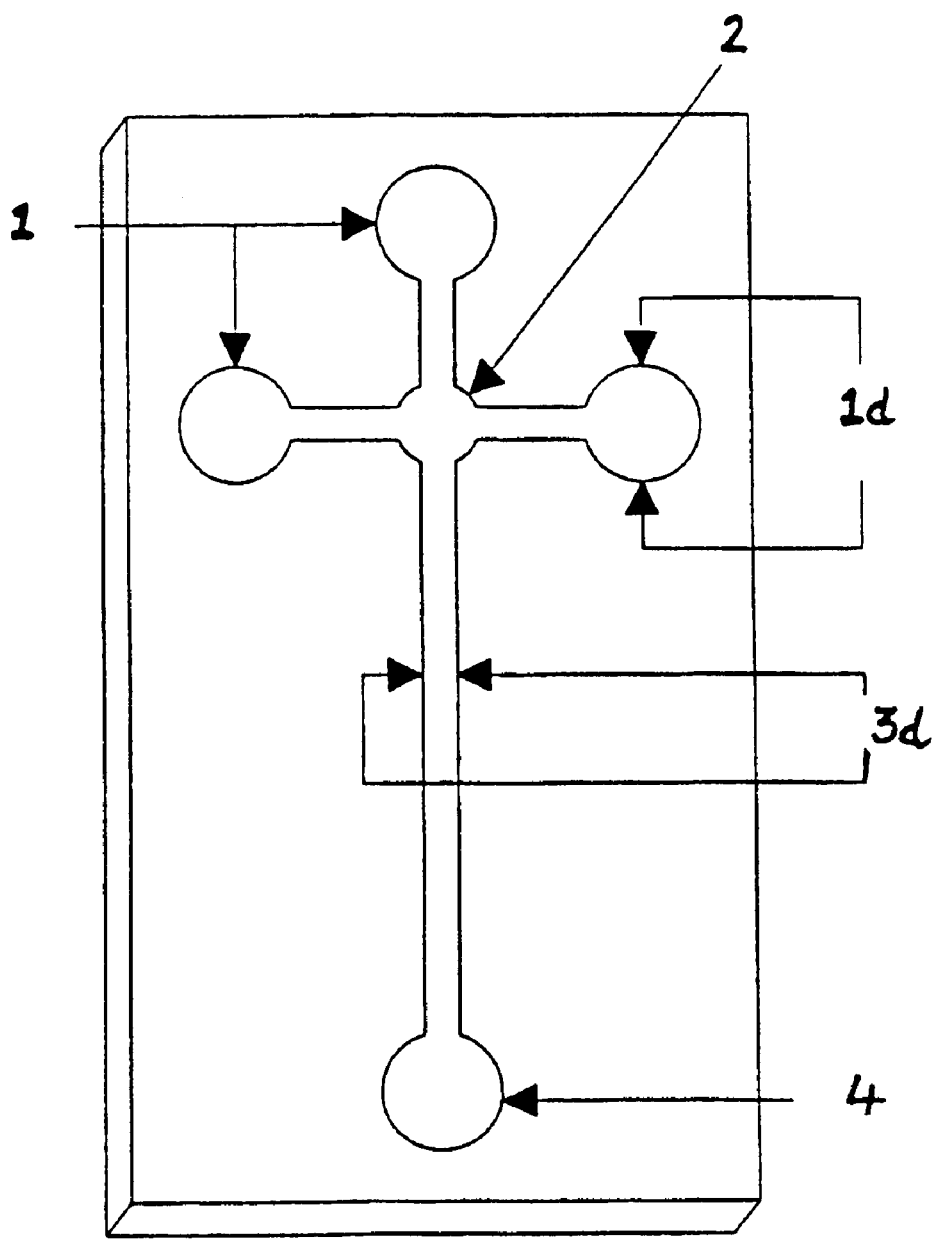

FIG. 1 shows a multiwell array, FIG. 2 shows a channel structure comprising sample/buffer reservoirs 1, e.g. 0.5–3 mm in diameter (1*d*), and a reaction/mixing chamber 2 connected Via a channel, e.g. 0.05–0.5 mm wide (3*d*), with a collection/waste reservoir 4.

Figure 3:
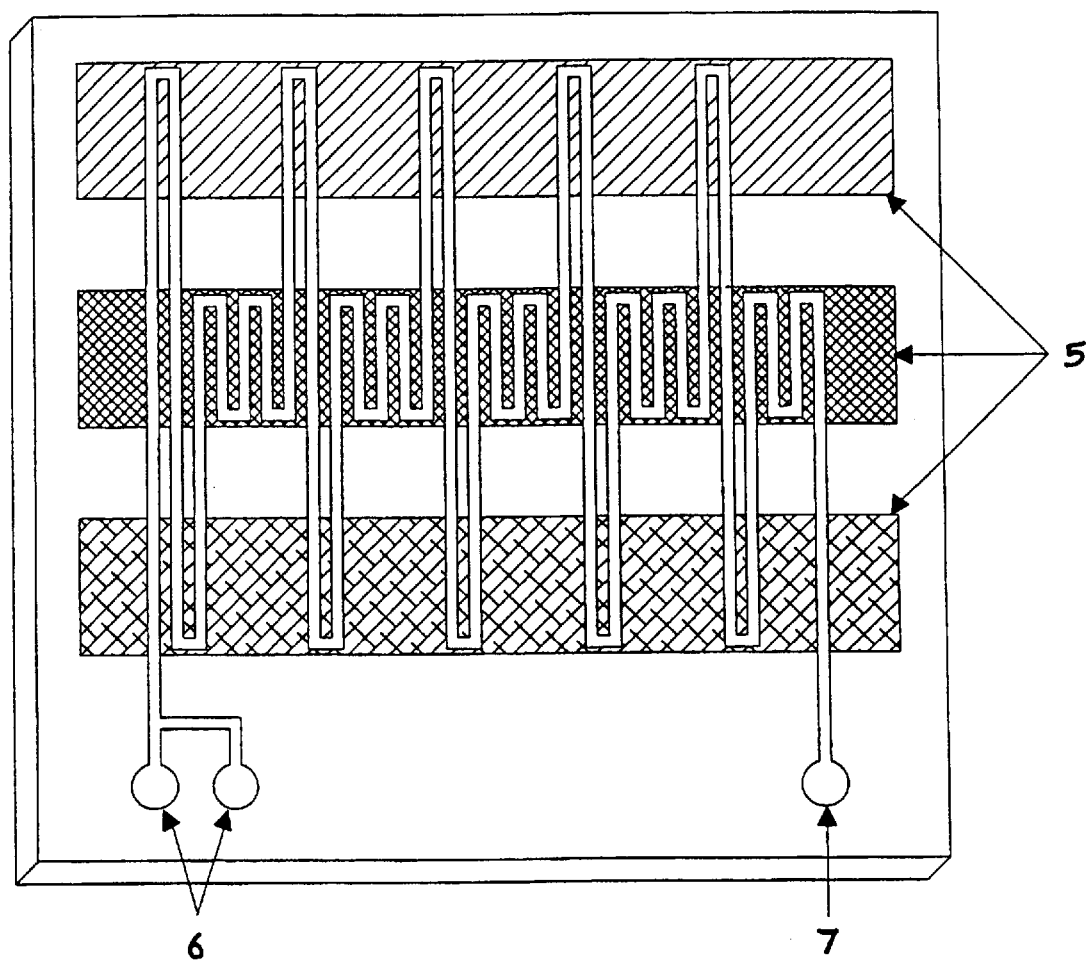

In one embodiment of the invention, the microchannel is patterned, by the use of a photomask, onto a UV crosslinkable polymer layer such as Carapace from Electra Polymers, deposited onto the polymeric substrate. After exposure to UV light, the microstructures are developed by treating the plastic sheet with an aqueous sodium carbonate solution. The microchannel structure may be laid over conducting layers, either screen-printed or of laminated conductive layers, to provide temperature control along the microchannel. Alternatively, the microchannel may be screen-printed. Such an embodiment is shown in FIG. 3, and includes thermnostatted conductive layers 5, inlet ports 6 and an outlet port 7.

Separation procedures such as, electrophoresis and chromatography may be performed on microchannels fabricated on polymeric substrates by screen printing and photolithographic methods. Surface properties of printed microchannels may be altered or modified by chemical means to produce a variety of chemical species including anionic, cationic and functionally-reactive groups on the inner walls of the channels.

In one embodiment, residual epoxide groups on the inner walls of the printed microchannel may be reacted with a bifunctional molecule, typically a primary amine and a carboxyl group separated by one or more methylene groups to produce a predominantly negatively-charged surface. Negative charge may also be introduced by passive adsorption of surface active agents such as polymers and surfactants. Electrophoretic separations may the be performed by application of a voltage across the separation channel.

In another embodiment, modification of the microchannel is achieved by printing a thin layer of, say, an epoxy polymer resin or functionalised vinyl resin containing silica microparticles on the plastics substrate, to provide a hydrophilic and charged surface. The sides of the channel can be printed with the same polymer composition.

In another embodiment, chromatographic separations including affinity and ion exchange chromatography may be performed by covalent attachment of ligands and ionogenic groups to the inner walls of the microchannel. Ligands may comprise antibodies, antigens, enzymes, substrates, hormones, receptors and synthetic organic molecules. Alternatively, microchannels may be filled with stationary separation media including naturally occurring polymers such as agarose, starch and cellulose, and synthetic chromatographic media such as polyacrylamide, polystyrene-divinylbenzene and silica. These gel-filled microchannels may be used to perform "nanoscale" separations using conventional chromatographic techniques.

A typical microchannel structure of this type is illustrated in FIG. 4. The channel 8 is, for example, 0.05–0.5 mm wide. It may contain charged species, a ligand L or a stationary phase SP; see FIGS. 5 and 6.

Figure 7:
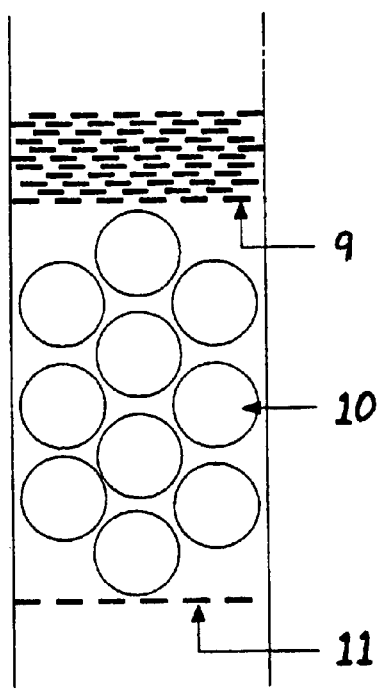
Figure 8:
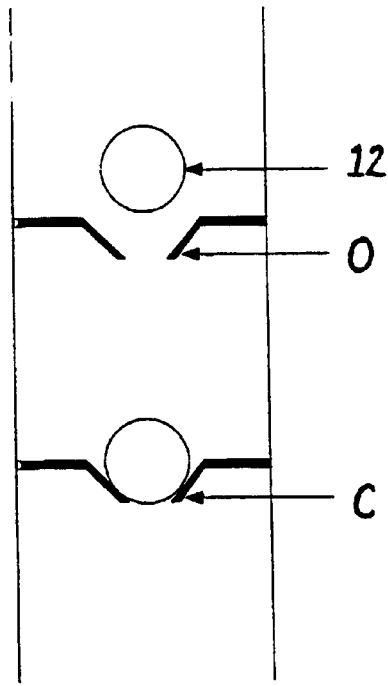

In a further embodiment, structures designed for liquid handling/manipulation may be fabricated within the microchannel using screen-printing and/or photolithography. Such structures include fiits, filters, valves and pumps. For example, FIG. 7 shows, within a microchannel, a filter 9, a stationary phase 10 and a flit 11 Analogously, FIG. 8 shows a magnetic particle 12 and a valve that is open (O) or closed (C).

The devices may be used with a small portable instrument. In this manner, a complete portable system may be constructed for field analysis of species, or for the analysis of samples in a GP's office or on a hospital ward. The output from the instrument is related to the level of the analyte in solution.

The device may also include a sample cell or porous layer to wick a sample onto the device from a container. The sample cell or porous layer may also contain buffers and/or other reagents to pre-treat the sample before it arrives at the device patterns. For instance, the sample cell or porous layer may include a buffer salt or surfactant to assist in the flow of plasma or whole blood. An assay device in accordance with this aspect of the invention may be used as a disposable unit which is plugged into an instrument for reading.

In the device of this invention the wells or channels can be at least 3 $\mu$m wide. The device can comprise more than 100 wells. The well of the device can be 50 to 500 $\mu$m in diameter. Also, the wells can be 5 to 300 $\mu$m deep. The device of the invention is water-resistant.

The following Examples illustrate the invention.

EXAMPLE 1

Arrays of microwells of dimensions 300–500 $\mu$m in diameter and 100 $\mu$m deep were screen-printed with a layer of dielectric material (Carapace from Electra Polymers and Chemicals Ltd, Kent, UK) on a plastic sheet made of polypropylene or polystyrene, to provide a plate of 9600 wells with a footprint similar to a 96-well microtitre plate. The printed arrays are cured at 80° C. for several hours. The depth of the wells can be increased by printing additional layers of dielectric material. The wells can then used to carry out binding reactions with reagents dispensed into the wells. Monitoring the reaction in the wells takes place by sensitive techniques including fluorescence and luminescence.

EXAMPLE 2

Arrays of microwells, 20–25 $\mu$m in diameter, were patterned onto a UV-crosslinkable polymer layer (Carapace) deposited onto a plastic sheet by the use of photomasks. After exposure to UV light, the wells were developed by treating the plastic sheet with an aqueous sodium carbonate solution.

EXAMPLE 3

A sheet of polypropylene 500 $\mu$m thick (Priplak, from Adhesive & Display Products, Northampton, UK) was printed with a layer, approximately 50 $\mu$m thick, of a UV-crosslinkable ink (Carapace). The microchannel structures were exposed onto the layer by using a positive photomask. The unexposed channels were stripped with a sodium carbonate solution. The microchannel structures correspond tol two crossed linear channels 1.5 and 4 cm in length respectively. The channels were 100 $\mu$m wide and 40–50 $\mu$m deep. At the termini of the channels, holes 3 mm in diameter were drilled as sample, buffer and collection reservoirs respectively. The channels were covered with an adhesive-backed Mylar sheet of thickness 250 $\mu$m.

Coloured dyes were injected at one port and observed to flow through the channels by capillary action. Such a circuit can be used in conjunction with electrodes inserted into reservoirs formed by connecting tubing to the four holes at the ends of the channels, for the electrokinetic control of both the flow rate and flow direction of species in the channels. Alternatively, the conductive electrodes can be printed at the base of the holes by screen-printing conductive inks.

What is claimed is:
1. A process for the production of a device having a surface microstructure of wells or channels, which consists essentially of providing a structure by applying onto a plastics substrate a material that is polymerizable or depolymerizable by irradiation and wherein the material that is unpolymerized or depolymerized is soluble in an aqueous developing solution, irradiating the structure through a photomask, and applying an aqueous developing solution to the irradiated structure and removing the unpolymerized or depolymerized material to produce the surface microstructure of wells or channels.

2. A process according to claim 1, wherein the wells or channels are from 3 $\mu$m to 100 $\mu$m wide.

3. A process according to claim 1, wherein the device is water-resistant, and the removing comprises removing only the unpolymerized or depolymerized material.

4. A process according to claim 3, wherein the device comprises from 100 to 9600 wells.

5. A process according to claim 3, wherein the device comprises wells that are 50 to 500 µm in diameter.

6. A process according to claim 3, wherein the device comprises wells that are 5 to 300 µm deep.

7. A process according to claim 3, wherein the device comprises channels, and which additionally comprises covering the channels.

8. A process according to claim 7, which additionally comprises forming reservoirs at the termini of the channels.

9. A process according to claim 8, which additionally comprises insertion of electrodes in the reservoirs.

* * * * *